US012676205B2

(12) United States Patent
Stoller et al.

(10) Patent No.: US 12,676,205 B2
(45) Date of Patent: Jul. 7, 2026

(54) HANDLING POWER-LOSS RESET EVENTS WITH BAD BLOCK RISK MITIGATION

(71) Applicant: Micron Technology, Inc., Boise, ID (US)

(72) Inventors: Scott Anthony Stoller, Boise, ID (US); Robert Winston Mason, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 133 days.

(21) Appl. No.: 18/818,078

(22) Filed: Aug. 28, 2024

(65) Prior Publication Data

US 2026/0066027 A1     Mar. 5, 2026

(51) Int. Cl.
*G11C 29/44*     (2006.01)
*G11C 29/12*     (2006.01)
*G11C 29/46*     (2006.01)

(52) U.S. Cl.
CPC .......... *G11C 29/44* (2013.01); *G11C 29/1201* (2013.01); *G11C 29/46* (2013.01)

(58) Field of Classification Search
CPC ...... G11C 29/44; G11C 29/1201; G11C 29/46
USPC ....................................................... 365/201
See application file for complete search history.

(56) References Cited

FOREIGN PATENT DOCUMENTS

| | | | | | |
|---|---|---|---|---|---|
| CN | 117112290 A | * | 11/2023 | .......... | G06F 11/1044 |
| WO | WO-2011031660 A2 | * | 3/2011 | .......... | G06F 11/1072 |

* cited by examiner

*Primary Examiner* — Fernando Hidalgo
(74) *Attorney, Agent, or Firm* — Schwegman Lundberg & Woessner, P.A.

(57) ABSTRACT

Various example embodiments provide for handling a power-loss reset (PLRESET) event in a memory system, such as a memory sub-system, with a technique that mitigates the risk of a good block being marked as bad, a memory die being retired prematurely, or both.

20 Claims, 6 Drawing Sheets

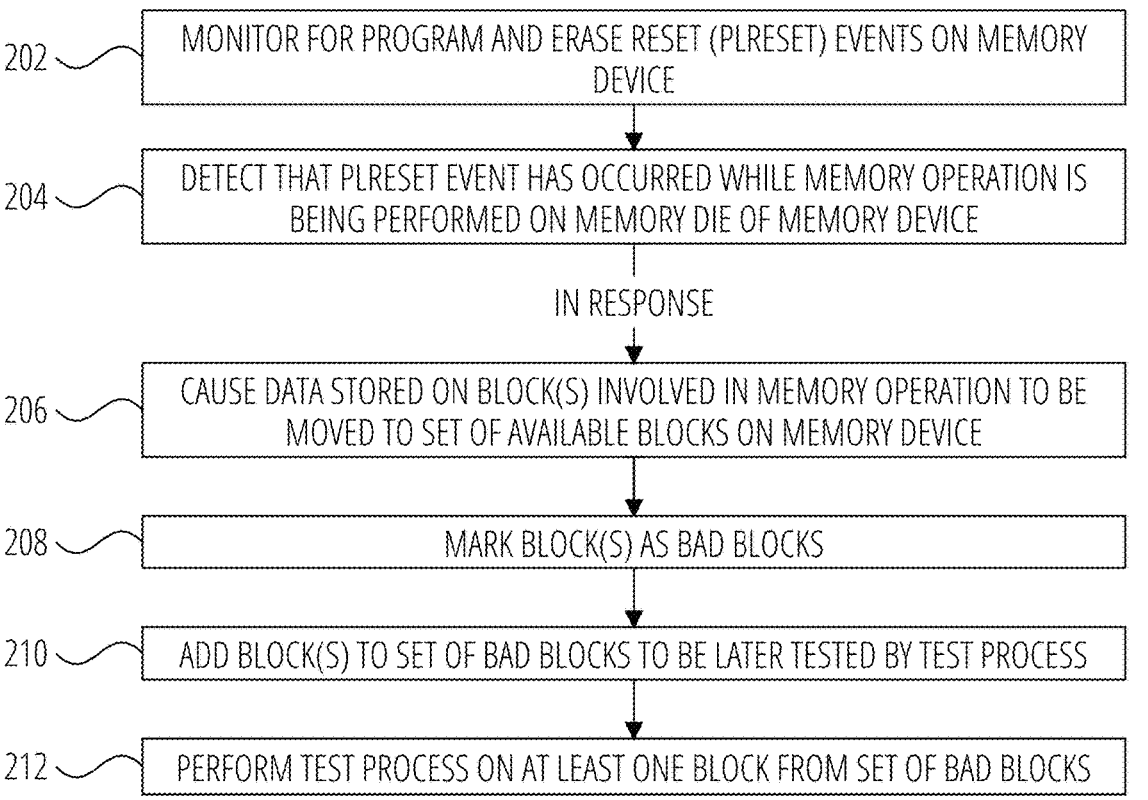

202   MONITOR FOR PROGRAM AND ERASE RESET (PLRESET) EVENTS ON MEMORY DEVICE

204   DETECT THAT PLRESET EVENT HAS OCCURRED WHILE MEMORY OPERATION IS BEING PERFORMED ON MEMORY DIE OF MEMORY DEVICE

IN RESPONSE

206   CAUSE DATA STORED ON BLOCK(S) INVOLVED IN MEMORY OPERATION TO BE MOVED TO SET OF AVAILABLE BLOCKS ON MEMORY DEVICE

208   MARK BLOCK(S) AS BAD BLOCKS

210   ADD BLOCK(S) TO SET OF BAD BLOCKS TO BE LATER TESTED BY TEST PROCESS

212   PERFORM TEST PROCESS ON AT LEAST ONE BLOCK FROM SET OF BAD BLOCKS

FIG. 2

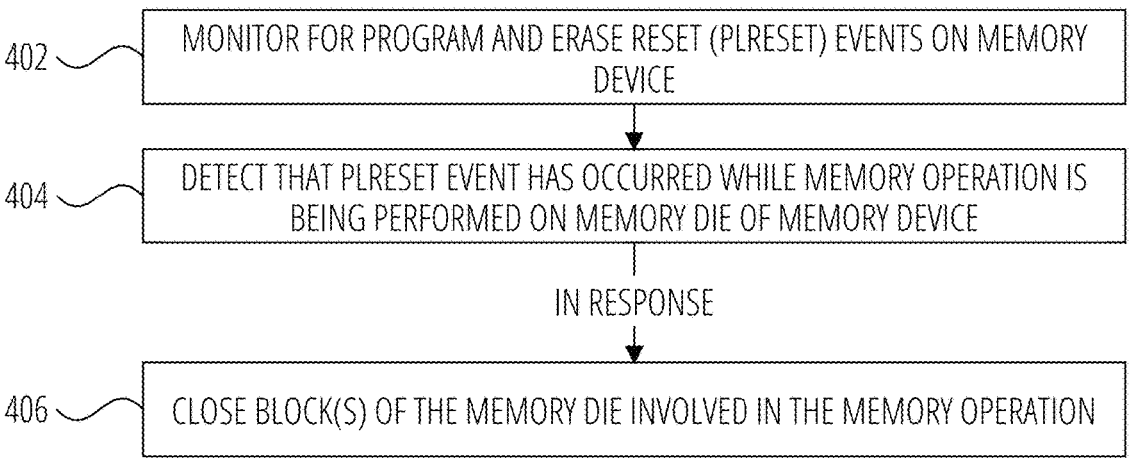
402 — MONITOR FOR PROGRAM AND ERASE RESET (PLRESET) EVENTS ON MEMORY DEVICE
404 — DETECT THAT PLRESET EVENT HAS OCCURRED WHILE MEMORY OPERATION IS BEING PERFORMED ON MEMORY DIE OF MEMORY DEVICE
IN RESPONSE
406 — CLOSE BLOCK(S) OF THE MEMORY DIE INVOLVED IN THE MEMORY OPERATION
FIG. 4

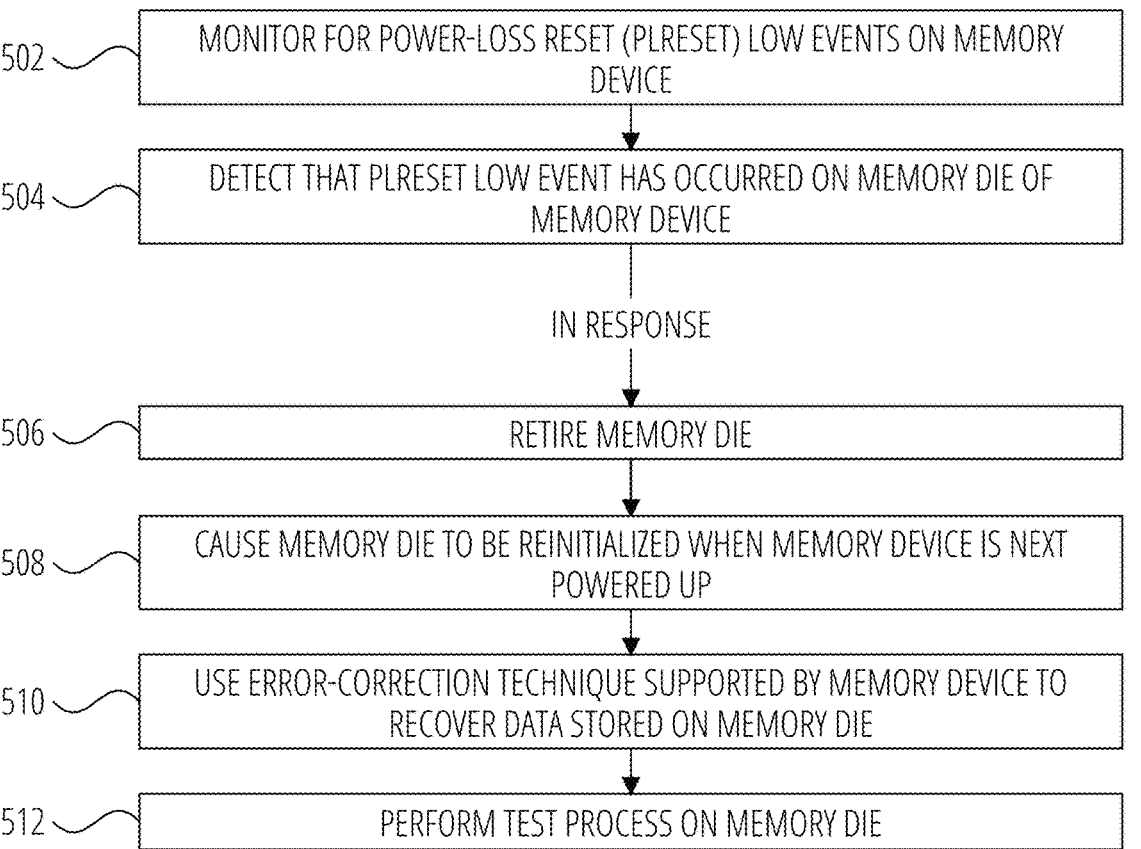

502 — MONITOR FOR POWER-LOSS RESET (PLRESET) LOW EVENTS ON MEMORY DEVICE

504 — DETECT THAT PLRESET LOW EVENT HAS OCCURRED ON MEMORY DIE OF MEMORY DEVICE

IN RESPONSE

506 — RETIRE MEMORY DIE

508 — CAUSE MEMORY DIE TO BE REINITIALIZED WHEN MEMORY DEVICE IS NEXT POWERED UP

510 — USE ERROR-CORRECTION TECHNIQUE SUPPORTED BY MEMORY DEVICE TO RECOVER DATA STORED ON MEMORY DIE

512 — PERFORM TEST PROCESS ON MEMORY DIE

FIG. 5

HANDLING POWER-LOSS RESET EVENTS WITH BAD BLOCK RISK MITIGATION

TECHNICAL FIELD

Embodiments of the disclosure relate generally to memory devices and, more specifically, to handling a power-loss reset event in a memory system (such as a memory sub-system) with a technique that mitigates the risk of a good block being marked as bad, a memory die being retired prematurely, or both.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various example embodiments of the disclosure. The drawings, however, should not be taken to limit the disclosure to the specific example embodiments, but are for explanation and understanding only.

FIG. 2 through FIG. 5 are flow diagrams illustrating example methods for handling a PLRESET event in a memory system with a technique that mitigates the risk of a good block being marked as bad, a memory die being retired prematurely, or both, in accordance with some example embodiments of the present disclosure.

DETAILED DESCRIPTION

Figure 1:
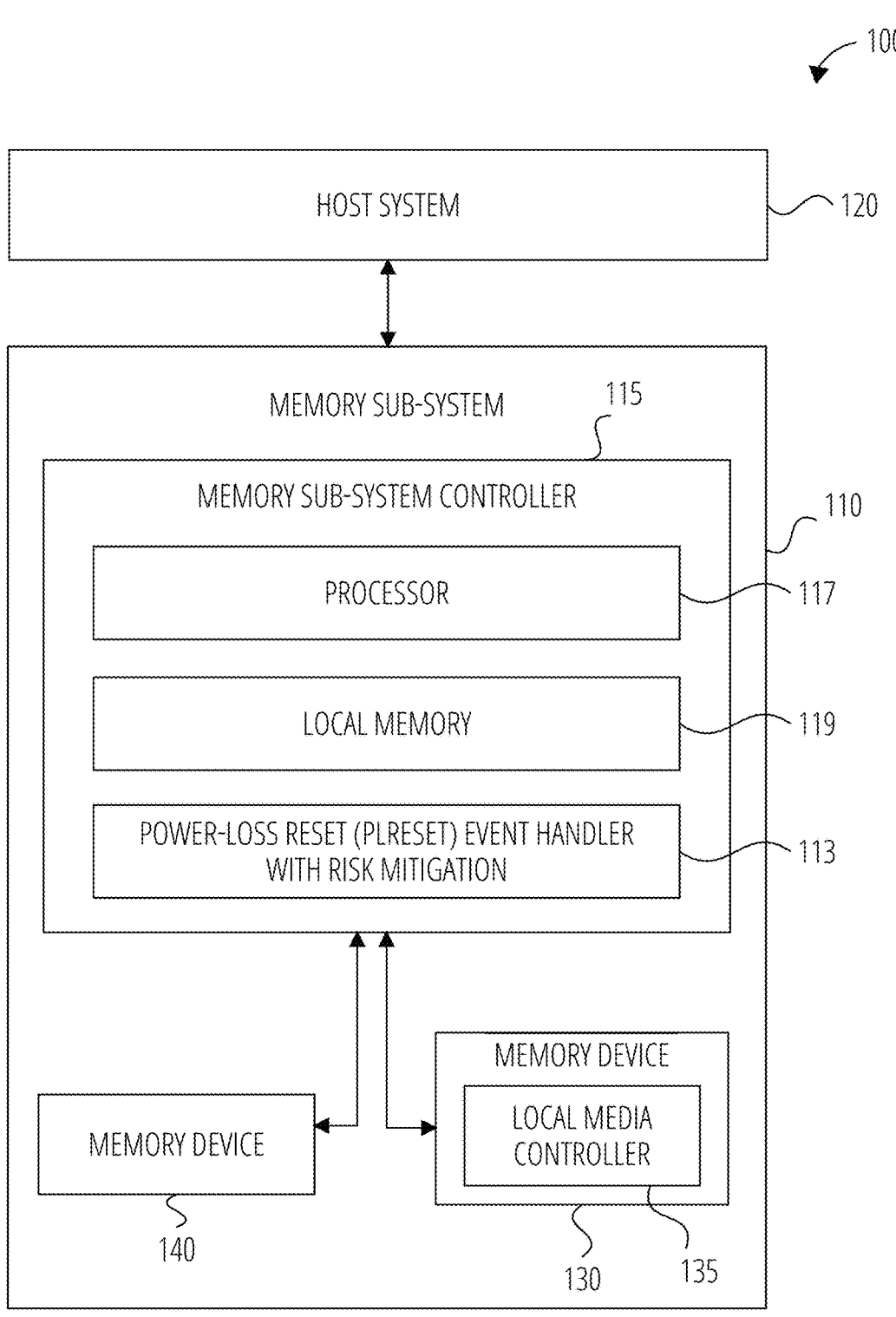
FIG. 1 is a block diagram illustrating an example computing system that includes a memory sub-system, in accordance with some example embodiments of the present disclosure.

Aspects of the present disclosure are directed to handling a power-loss reset event in a memory system (such as a memory sub-system) with a technique that mitigates the risk of a good block being marked as bad, a memory die being retired prematurely, or both. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can send access requests to the memory sub-system, such as to store data at the memory sub-system and to read data from the memory sub-system.

The host system can send access requests (e.g., write command, read command) to the memory sub-system, such as to store data on a memory device at the memory sub-system, read data from the memory device on the memory sub-system, or write/read constructs (e.g., such as submission and completion queues) with respect to a memory device on the memory sub-system. The data to be read or written, as specified by a host request, is hereinafter referred to as "host data" or "user data."

A host request can include logical address information (e.g., logical block address (LBA), namespace) for the host data, which is the location the host system associates with the host data and a particular zone in which to store or access the host data. The logical address information (e.g., LBA, namespace) can be part of metadata for the host data. Metadata can also include error handling data (e.g., error-correcting code (ECC) code word, parity code), data version (e.g., used to distinguish age of data written), valid bitmap (which LBAs or logical transfer units contain valid data), and so forth.

The memory sub-system can initiate media management operations, such as a write operation, on host data that is stored on a memory device. For example, firmware of the memory sub-system may re-write previously written host data from a location of a memory device to a new location as part of garbage collection management operations. The data that is re-written, for example as initiated by the firmware, is hereinafter referred to as "garbage collection data."

"User data" hereinafter generally refers to host data and garbage collection data. "System data" hereinafter refers to data that is created and/or maintained by the memory sub-system for performing operations in response to host requests and for media management. Examples of system data include, and are not limited to, system tables (e.g., logical-to-physical memory address mapping table (also referred to herein as a L2P table), data from logging, scratch pad data, and so forth).

A memory device can be a non-volatile memory device. A non-volatile memory device is a package of one or more die. Each die can be comprised of one or more planes. For some types of non-volatile memory devices (e.g., AND-type devices), each plane is comprised of a set of physical blocks. For some memory devices, blocks are the smallest area that can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which are a raw memory device combined with a local embedded controller for memory management within the same memory device package. The memory device can be divided into one or more zones where each zone is associated with a different set of host data or user data or application.

Generally, writing data to NAND-type memory devices involves programming (by way of a program operation) the NAND-type memory devices at the page level of a block, and erasing data from such memory devices involves erasing the memory devices at the block level (e.g., page level erasure of data is not possible). Certain memory devices, such as NAND-type memory devices, comprise one or more blocks, (e.g., multiple blocks) with each of those blocks comprising multiple pages, where each page comprises a subset of memory cells of the block, and where a single wordline of a block (which connects a group of memory cells of the block together) defines one or more pages of a block (depending on the type of memory cell). Depending on the embodiment, different blocks can comprise different types of memory cells. For instance, a block (a single-level cell (SLC) block) can comprise multiple SLCs, a block (a multi-level cell (MLC) block) can comprise multiple MLCs, a block (a triple-level cell (TLC) block) can comprise multiple TLCs, and a block (a quad-level cell (QLC) block)

can comprise QLCs. Other blocks comprising other types of memory cells (e.g., higher-level memory cells, having higher bit storage-per-cell) are also possible.

Memory sub-systems can employ error-correction techniques, such as using a redundant array of independent NAND-type memory devices (hereafter, referred to as a RAIN technique), to protect data (e.g., host or user data) stored on the memory sub-systems. Error-correction techniques can comprise calculating parity (e.g., exclusive OR (XOR) parity) across some collection of data (e.g., host/user data) being error-protected. By such error-correction techniques, if a data member of the collection is lost (e.g., corrupted) for any reason, the parity calculation can be re-performed and the lost data recreated. With a RAIN technique (or RAIN protection scheme), data is striped (e.g., split) so that different portions of the data are stored across different pages or blocks of different memory die devices of one or more NAND-type memory devices. The pages or blocks of the different memory die that store the split data are collectively referred to as a stripe. When the split data is completely written across a given stripe of pages or blocks of a specified set of memory die of one or more NAND-type memory devices, the RAIN parity calculation is performed and stored in a parity page or block associated with the given stripe. An individual RAIN stripe can comprise the individual stripe (of pages or blocks) storing split data and the parity page or block for the individual stripe. In certain instances, a RAIN stripe comprises a single superblock.

As used herein, a superblock comprises a plurality of blocks across one or more (e.g., all) of planes of one or more (e.g., all) memory die (e.g., NAND-type memory die) of a memory device. Each individual block of a superblock of a memory die can be associated with an index value (e.g., intra-die index value) that indicates a logical or physical position of the individual block within the individual block's respective plane of the memory die. A superblock can, for example, be formed by blocks in a same position across multiple planes (e.g., a same logical or physical position on each plane of multiple planes) of a single memory circuit die (or single memory die) or of multiple memory die (e.g., that form a memory array). Where a memory system implements a RAIN technique, an individual superblock can be formed by a single block from each of multiple planes of each of multiple memory die of a memory device.

As used herein, power-loss (or partial power-loss) reset (or PLRESET) refers to a feature of a memory device of a memory system that aborts an ongoing memory operation (e.g., read, write, or erase operation) performed on a memory die of a memory device (e.g., being performed on a page or block of the memory device) when the memory die (or the memory device) detects a fluctuation or a droop in a supply voltage (e.g., input voltage) to the memory die (e.g., due to voltage being pulled from one voltage rail), where the aborting of the memory operation can allow a voltage rail supplying voltage to the memory die to recover and can prevent a power loss situation in the memory system (e.g., on the memory die or on the memory device). For example, a PLRESET can occur on a memory die of a memory device while the memory device is performing a read, a write (e.g., programming), or erase operation on the memory die (e.g., NAND-type memory die) in accordance with a command issued to the memory device by the memory system (e.g., memory system controller). When a PLRESET event occurs on a memory die of a memory device, the memory device usually informs or notifies the memory system (e.g., memory system controller) of the PLRESET event (or PLRESET occurrence) via a status register, which indicates to the memory system that a memory operation was not completed (e.g., data was not written to a memory location on a memory die, or data was not successfully erased from the memory location).

For certain conventional memory systems, there are two types of PLRESET events: (1) a normal PLRESET event (hereafter, also referred to as a PLRESET non-low event) that occurs when a supply voltage to a memory die (e.g., NAND-type memory die) drops below a normal voltage threshold; and (2) a PLRESET low event that occurs when a supply voltage to a memory die drops below a low voltage threshold, where the low voltage threshold is lower than the normal voltage threshold and represents a voltage under which proper transistor (e.g., CMOS (Complementary Metal-Oxide-Semiconductor)) operation cannot be ensured. For example, in an SSD that uses a VCC supply voltage of 2.5V, the normal voltage threshold (for normal PLRESET events) can be 2.1V, and the low voltage threshold (for PLRESET low events) can be around 1.9V. While a normal PLRESET event results in the aborting of an ongoing memory operation being performed on a memory die, a PLRESET low event usually result in a shutdown (e.g., CMOS shutdown) of a memory die that experienced the PLRESET low event. After a PLRESET low event, the memory die can remain shut down until the supply voltage to the memory die returns to a level above the low voltage threshold, at which time the memory die can be reinitialized.

In conventional memory systems, the supply voltage (e.g., VCC supply voltage) to memory die (e.g., NAND-type memory die) is sufficiently far from a normal voltage threshold for a normal PLRESET event that normal PLRESET events and PLRESET low events are very rare. Conventional memory systems usually handle a normal PLRESET event that occurs during a memory operation (e.g., read, write, or erase operation) by marking one or more blocks of a memory die involved in the memory operation (e.g., multiple blocks where the memory operation is a multiplane operation) as bad blocks (e.g., grown bad block (GBB)). This is usually the same thing that happens when a read, write, or erase operation being performed on the one or more block fails (e.g., due to an actual NAND-type memory die defect). Most conventional memory systems, especially enterprise-level memory systems (e.g., enterprise SSDs) where the input voltage tends to remain stable, will experience zero bad blocks (e.g., GBBs) due to normal PLRESET events. However, if there is a hardware or memory die defect that causes multiple normal PLRESET events on a memory system, it is important that the memory system gracefully handles these events and eventually retires the bad die or gracefully enters write protect mode.

Rather than shutting down a memory die in the event of a PLRESET low event and reinitializing the memory die when a supply voltage to the memory die returns to a value above a low voltage threshold, conventional memory systems often handle PLRESET low events by immediately retiring of the memory die (after which the memory die is no longer available for use by a memory system). This is because there is currently no good approach to reinitializing a memory die (after shutdown) during normal operation of a memory system (e.g., there are challenges associated with interface mode switching to reconfigure the memory die and set it back up for high-speed operation with data training and calibration, etc.). Additionally, the retirement approach for handling PLRESET low events is acceptable because PLRESET low events (like normal PLRESET events) are rare and would typically be indicative of a hardware failure that would significantly impair the memory system's ability to continue operating normally (an immediate retirement of the memory die would be beneficial in such a situation).

Unfortunately, while conventional PLRESET handling's approach of marking blocks as bad (e.g., growing GBBs) when a normal PLRESET event occurs is useful in facilitating the graceful handling of multiple normal PLRESET events, this approach can also result in a number of blocks that are actually good blocks (e.g., that lack any defects) being marked as bad blocks due to conventional PLRESET handling. Normal PLRESET events usually occur due to a voltage supply issue that exists outside a memory die (e.g., NAND-type memory die) and not due to a defect at a memory location (e.g., at a page) within a block. Conventional PLRESET handling is poor at handling a PLRESET event (e.g., normal PLRESET events and PLRESET low events) caused by high-frequency input noise from a host system coupled to a memory system (which is an uncommon situation but nevertheless can still occur), and the conventional PLRESET handling can cause premature failure of the memory system.

Further, to achieve maximum energy savings on memory systems, it is desirable to reduce the supply voltage (e.g., VCC supply voltage) used by memory die as much as possible. Unfortunately, when the supply voltage is reduced, the probability of PLRESET events (e.g., normal PLRESET events and PLRESET low events) occurring increases significantly. Accordingly, as memory system manufacturers aim to reduce supply voltages to memory die (thereby reducing the voltage margin on the power rail between the supply voltage and a PLRESET voltage threshold), handling normal PLRESET events by marking blocks as bad (e.g., GBB) and handling PERSET low events with memory die retirement no longer remains good solutions, as it may become commonplace for conventional memory systems to experience multiple normal PLRESET events throughout their useful life (e.g., in a customer's storage solution). Marking blocks as bad too frequently due to normal PLRESET events can cause loss of operational performance or prematurely send the memory system into a write-protect state. Additionally, premature or early memory die retirement due to PLRESET low events can have a significant impact on the memory system.

Various example embodiments described herein cure these and other deficiencies of PLRESET handling in conventional memory systems. In particular, various example embodiments provide for PLRESET handling in a memory system (such as a memory sub-system) with a technique that mitigates (or otherwise addresses) the risk of a good block being marked as bad, a memory die being retired prematurely, or both. According to various example embodiments, a memory system handles a normal PLRESET event during an ongoing memory operation involving one or more blocks by one or more methods. According to one method, the one or more blocks are allowed to be marked bad (e.g., as GBB) and go back later and write data to the one or more blocks to test it. Testing the one or more blocks could comprise performing erase, program, and read operations on the one or more blocks. If a certain a series of memory array operations to the one or more blocks passes without a PLRESET event occurring, then the one or more block can be moved back to a good block pool for reuse. The PLRESET threshold used to detect for the normal PLRESET events can be temporarily adjusted (e.g., via a NAND set trim command) to perform a stricter test on the one or more blocks.

According to another method, the one or more blocks are folded (e.g., just like a program status failure) but the one or more blocks are kept in the good block pool and not marked as bad blocks. A count of PLRESET events (e.g., tracked by memory channel, logical unit number (LUN) block, or the like) can be maintained, and any memory die or block that has a count of PLRESET events exceeding a particular threshold value can be marks as a bad block (e.g., GBB).

According to some example embodiments, a memory system handles a PLRESET low event for a memory die of a memory device by one or more methods. One method can comprise retiring the memory die at the time of the PLRESET low event, recovering data stored on the retired memory die using an error-correction technique (e.g., via a RAIN error-correction technique), and continuing memory system operation. The next time the memory system powers on, the memory system can attempt to reinitialize the memory die normally. One or more additional tests can be performed on the memory die after successful reinitialization and before it is used again by the memory system. The memory die testing can comprise multiple erase, program, read operations, which can include higher threshold values for detecting normal PLRESET events and PLRESET low events.

Various example embodiments can permit a memory system to use a reduced supply voltage (e.g., reduced VCC supply voltage) to a memory die (e.g., NAND-type memory die) and save energy on certain types of memory systems, such as enterprise memory systems (e.g., enterprise SSDs), while mitigating marking of blocks as bad (e.g., GBB) and die retirement failures (e.g., due to brownouts on power rails that power to the memory die). In particular, by providing improved handling of PLRESET events, PLRESET low events, or both, various example embodiments can enable a memory system to avoid unnecessary bad blocks and loss of operational performance when PLRESET events occur. Various example embodiments can reduce the impact of PLRESET low events by avoiding permanent memory die loss failure. PLRESET low events due to host system-induced reasons, such as high-frequency input voltage noise, can be avoided and a memory system can instead continue to function. Additionally, some example embodiments described herein can facilitate testing and assessing supply voltage (e.g., VCC) headroom during memory system development and high-volume manufacturing to catch potential hardware design issues or manufacturing variability before memory systems are shipped to customers.

Disclosed herein are some examples of handling a PLRESET event (e.g., normal PLRESET event or a PLRESET low event) in a memory system, such as a memory sub-system, with a technique that mitigates the risk of a good block being marked as bad, a memory die being retired prematurely, or both, as described herein.

FIG. 1 illustrates an example computing system 100 that includes a memory sub-system 110, in accordance with some example embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, a secure digital (SD) card, an embedded Multi-Media Controller (eMMC) drive, a Universal Flash Storage (UFS) drive, and a hard disk drive (HDD). Examples of memory modules include a dual in-line memory module (DIMM), a small outline DIMM (SO- DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. The computing system 100 can be used to support or implement various types of applications, including those relating to artificial intelligence (AI).

The computing system 100 can include a host system 120 that is coupled to one or more memory sub-systems 110. In some example embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., a peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a compute express link (CXL) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory devices 130, 140 when the memory sub-system 110 is coupled with the host system 120 by the PCIe or CXL interface. The physical host interface can provide an interface for passing control, address, data, and other signals between the memory sub-system 110 and the host system 120.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a NAND type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional (2D) NAND and 3D NAND.

Each of the memory devices 130, 140 can include one or more arrays of memory cells. One type of memory cell, for example, SLCs, can store one bit per cell. Other types of memory cells, such as MLCs, TLCs, QLCs, and penta-level cells (PLCs), can store multiple bits per cell. In some example embodiments, each of the memory devices 130, 140 can include one or more arrays of memory cells such as SLCs, MLCs, TLCs, QLCs, or any combination of such. In some example embodiments, a particular memory device can include an SLC portion, and an MLC portion, a TLC portion, or a QLC portion of memory cells. The memory cells of the memory devices 130, 140 can be grouped as pages that can refer to a logical unit of the memory device used to store data. With some types of memory (e.g., NAND), pages can be grouped to form blocks. As used herein, a block comprising SLCs can be referred to as a SLC block, a block comprising MLCs can be referred to as an MLC block, a block comprising TLCs can be referred to as a TLC block, and a block comprising QLCs can be referred to as a QLC block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide-based RRAM (OxRAM), negative-or (NOR) flash memory, and electrically erasable programmable read-only memory (EEPROM).

A memory sub-system controller 115 (or controller 115 for simplicity) can communicate with the memory devices 130, 140 to perform operations such as reading data, writing data, or erasing data at the memory devices 130, 140 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some example embodiments, the local memory 119 can include memory registers storing memory pointers, fetched data, and so forth. The local memory 119 can also include ROM for storing micro-code. While the example memory sub-system 110 in FIG. 1 has been illustrated as including the memory sub-system controller 115, in another example embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and ECC operations, encryption operations, caching operations, and address translations between a logical address (e.g., LBA, namespace) and a physical memory address (e.g., physical block address) that are associated with the memory devices 130, 140. The memory sub-system controller 115 can further include host interface circuitry to communicate with the host system 120 via the physical host interface. The host interface circuitry can convert the commands received from the host system 120 into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some example embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130, 140.

In some example embodiments, the memory device 130 includes local media controller 135 that operates in conjunction with memory sub-system controller 115 to execute operations on one or more memory cells of the memory device 130. An external controller (e.g., memory sub-system controller 115) can externally manage the memory device 130 (e.g., perform media management operations on the memory device 130). In some example embodiments, a memory device 130 is a managed memory device, which is a raw memory device combined with a local controller (e.g., local media controller 135) for media management within the same memory device package. An example of a managed memory device is a managed NAND (MNAND) device.

The memory sub-system controller 115 includes a power-loss reset (PLRESET) event handler 113 with risk mitigation (hereafter, the PLRESET event handler 113) that enables or facilitates the memory sub-system controller 115 to implement handling of a PLRESET event (e.g., normal PLRESET event or a PLRESET low event) in the memory sub-system 110 with a technique that mitigates the risk of a good block being marked as bad, a memory die being retired prematurely, or both in accordance with various example embodiments described herein. Alternatively, some or all of the PLRESET event handler 113 is included by the local media controller 135, thereby enabling the local media controller 135 to enable or facilitate handling of a PLRESET event on the memory sub-system 110.

FIG. 2 through FIG. 5 are flow diagrams illustrating example methods 200, 300, 400, 500 for handling a PLRESET event in a memory system with a technique that mitigates the risk of a good block being marked as bad, a memory die being retired prematurely, or both, in accordance with some example embodiments of the present disclosure. Any of methods 200, 300, 400, 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some example embodiments, any of methods 200, 300, 400, 500 is performed by the memory sub-system controller 115 of FIG. 1 based on the PLRESET event handler 113. Additionally, or alternatively, for some example embodiments, any of methods 200, 300, 400, 500 is performed, at least in part, by the local media controller 135 of the memory device 130 of FIG. 1. Although shown in a particular sequence or order, unless otherwise specified, the order of the processes can be modified. Thus, the illustrated example embodiments should be understood only as examples, and the illustrated processes can be performed in a different order, and some processes can be performed in parallel. Additionally, one or more processes can be omitted in various example embodiments. Thus, not all processes are used in every example embodiment. Other process flows are possible.

Referring now to method 200 of FIG. 2, method 200 represents a method for handling a PLRESET event in a memory system with a technique that mitigates the risk of a good block being marked as bad. At operation 202, a processing device (e.g., the processor 117 of the memory sub-system controller 115) monitors for PLRESET events on a memory device (e.g., 130, 140) of a memory system (e.g., memory sub-system 110). For various example embodiments, a PLRESET event (e.g., a normal PLRESET event) comprises a memory die (of a memory device) aborting any ongoing memory operations on the memory die in response to a supply voltage to the memory die dropping below a threshold voltage value.

During operation 204, the processing device detects that a PLRESET event (e.g., normal PLRESET event) has occurred while a memory operation is being performed on a memory die (e.g., NAND-type memory die) of the memory device (e.g., memory operation being performed on a block or a page of a block at a memory location on the memory die), where the PLRESET event comprises the memory die aborting the memory operation in response to a supply voltage to the memory die dropping below a threshold voltage value. For some example embodiments, the memory operation comprises a read operation, a write (e.g., program) operation, or an erase operation. Additionally, for some example embodiments, the memory operation is a multiplane operation (e.g., multiplane read, write, or erase operation) that operates on two or more blocks (e.g., in parallel) on the memory die.

In response to detecting that the PLRESET event occurred on the memory device while the memory operation is being performed on the memory die, method 300 proceeds to operation 206, where the processing device causes data stored on the one or more blocks (involved in the aborted memory operation) to be moved to a set of available blocks on the memory device. For some example embodiments, the processing device performs performing a folding operation on the one or more blocks to cause the data to be moved to the set of available blocks.

During operation 208, the processing device marks the one or more blocks (involved in the aborted memory operation) as bad blocks. For example, the processing device can mark the one or more blocks as grown bad blocks (GBB). Additionally, to mark the one or more blocks as bad, the processing device can add the one or more blocks to a bad block pool (e.g., a GBB pool) maintained by the memory system (e.g., the memory sub-system controller 115 of the memory sub-system 110).

At operation 210, the processing device adds the one or more blocks (involved in the aborted memory operation) to a set of bad blocks to be later tested by a test process. The set of bad blocks can be implemented as a list or a pool of blocks maintained by the memory system (e.g., the memory sub-system controller 115 of the memory sub-system 110) to identify blocks of the memory device (e.g., 130, 140) that were marked as bad (e.g., GBB) due to a PLRESET event and need subsequent testing to confirm that the blocks should remain as bad blocks.

Subsequently, at operation 212, the processing device performs a test process on at least one block from the set of bad blocks. For example, the processing device can perform the test process on the one or more blocks added to the set of bad blocks at operation 210. Depending on the example embodiment, the performance of the test process can be triggered periodically or based on a condition being satisfied (e.g., the test process is performed as a background process when the memory system is idle or a memory device including the at least one block is idle). When performance of the test process is triggered, the test process can check whether there are any blocks in the set of bad blocks to be tested and begin testing one or more blocks from the set of bad blocks (e.g., the set of bad blocks can comprise an ordered list, and the blocks are tested in the order in which they were added to the ordered list). After the test process has been performed on an individual block from the set of bad blocks at least once, the individual block can be removed from the set of bad blocks (to avoid the individual block from being retested again).

For various example embodiments, performing the test process on an individual block comprises at least one: erasing any data from the individual block; writing data to the individual block; or reading data from the individual block. For example, to verify whether the individual block is a bad block, the test process can first erase any data from the individual block, then write test data to the individual block, and then read back the test data stored on the individual block. If the read operation on the individual block fails or the test data read back from the individual block is not the same as the test data written to the individual block, the test process would leave the individual block marked as bad. However, if the read operation is successful and the test data read back from the individual block is the same as the test data written to the individual block, the test process can mark the individual block as good and can return the individual block to a pool of blocks available for use on the memory system.

For some example embodiments, performing the test process on an individual block comprises performing a set of memory operations on the individual block, and monitoring whether any PLRESET events occur while the set of memory operations is performed on the individual block. If the set of memory operations are completed without a PLRESET event occurring, the test process can mark the individual block as good and can return the individual block to a pool of blocks available for use on the memory system. However, if at least one PLRESET event occurs during performance of the set of memory operations, the test process would leave the individual block marked as bad.

For a test process that is detecting for occurrences of a PLRESET event, the processing device can adjust (e.g., temporarily adjust) a threshold voltage value used to trigger a PLRESET event (e.g., normal PLRESET event or PLRESET low event) to a second value that is lower than the current (first) value of the threshold voltage value, where the current value can represent a normal, standard, or default value. In doing so, various example embodiments can subject one or more blocks from the set of bad blocks with stricter testing constraints when attempting to confirm whether those one or more blocks are actually bad. According to some example embodiments, performing the test process on an individual block comprises: adjusting a threshold voltage value to a second value that is lower than a (current) first value; and then performing a set of memory operations on the individual block while monitoring whether any PLRESET events occur. Before the test process concludes, the test process can revert the threshold voltage value back to its previous value (e.g., the first value). For some example embodiments, the test process uses a trim command, such as a NAND set trim command (e.g., issued by the processing device to a memory device or a memory die of the memory device), to adjust the threshold voltage value for triggering PLRESET events on an individual memory die or on multiple memory die of a memory device.

Figure 3:
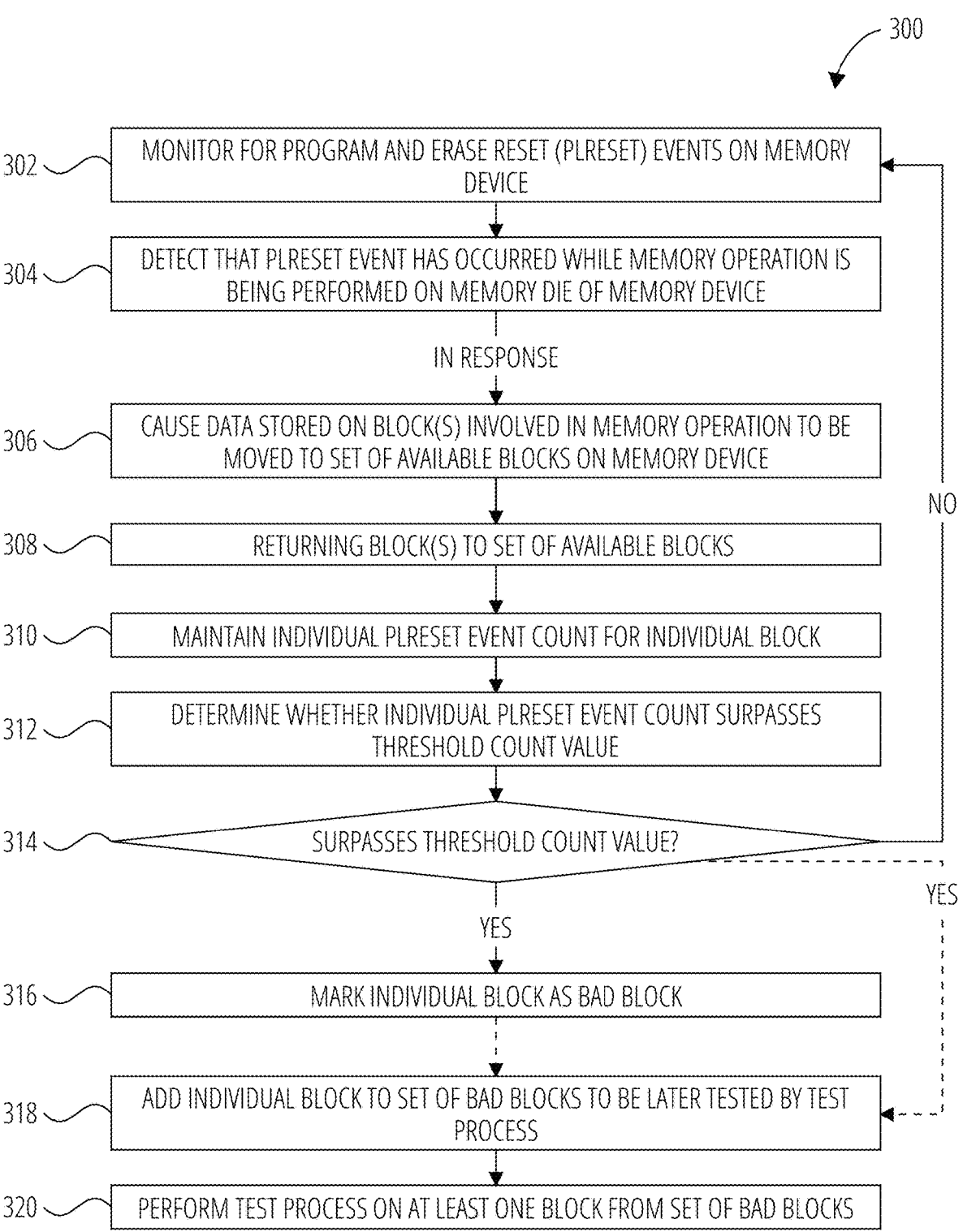

Referring now to FIG. 3, method 300 represents another method for handling a PLRESET event in a memory system with a technique that mitigates the risk of a good block being marked as bad. Operations 302, 304, 306 are respectively similar to operations 202, 204, 206 of method 200 illustrated and described with respect to FIG. 2.

At operation 308, the processing device returns the one or more blocks (involved in the aborted memory operation) to a set of blocks available for use (e.g., by new write operations). For some example embodiments, operation 308 comprises marking the one or more blocks as good blocks. The set of good blocks can comprise a pool of good/available blocks maintained by the memory system (e.g., the memory sub-system controller 115 of the memory sub-system 110).

At operation 310, the processing device maintains an individual PLRESET event count for an individual block from the one or more blocks. Alternatively, or additionally, the processing device can maintain a PLRESET event count per a memory channel of the memory system, a PLRESET event count per a memory die of a memory device (e.g., 130, 140) of the memory system, or a PLRESET event count per logical unit number (LUN) of the memory system (e.g., memory sub-system 110).

At operation 312, the processing device determines whether the individual PLRESET event count for the individual block surpasses a threshold count value. Operation 312 can be performed as part of a process where the processing device monitors PLRESET event counts to determine whether any of the counts surpass the threshold count value. Alternatively, or additionally, the PLRESET event count (being checked at operation 312) used by operation 312 can be the PLRESET event count for a memory channel associated with the individual block, the PLRESET event count for the memory die associated with the individual block, or the PLRESET event count for the LUN associated with the individual block. Depending on the example embodiment, the threshold count value used can be determined by the memory system automatically (e.g., using an algorithm or based on memory system conditions/settings), user-defined (e.g., by an administrative user), or set by a manufacturer of the memory system.

At decision block 314, in response to the processing device determining (at operation 312) that the individual PLRESET event count surpasses a threshold count value, method 300 proceeds to operation 316, where the processing device marks the individual block as a bad block. For example, the processing device can mark the individual block as a GBB. Additionally, to mark the individual block as a bad block, the processing device can add the individual block to a bad block pool (e.g., a GBB pool) maintained by the memory system (e.g., the memory sub-system controller 115 of the memory sub-system 110). However, at decision block 314, in response to the processing device determining (at operation 312) that the individual PLRESET event count does not surpass the threshold count value, method 300 returns to operation 302, where the processing device can wait for the next PLRESET event to be detected (e.g., triggered). Alternatively, at decision block 314, in response to the processing device determining (at operation 312) that the individual PLRESET event count surpasses the threshold count value, method 300 can proceed directly to operation 318 and skip operation 316 (as illustrated in FIG. 3).

From operation 316, method 300 proceeds to operation 318, where the processing device adds the individual block to a set of bad blocks to be later tested by a test process. As described herein, the set of bad blocks can be implemented as a list or a pool of blocks maintained by the memory system (e.g., the memory sub-system controller 115 of the memory sub-system 110) to identify blocks of the memory device (e.g., 130, 140) that need subsequent testing to determine whether the blocks are bad blocks. Eventually, at operation 320, the processing device performs a test process on at least one block from the set of bad blocks. For various example embodiments, operation 320 is similar to operation 212 of method 200 illustrated and described with respect to FIG. 2.

Referring now to FIG. 4, method 400 represents another method for handling a PLRESET event in a memory system with a technique that mitigates the risk of a good block being marked as bad. Operations 402 and operation 404 are respectively similar to operations 202 and 204 of method 200 illustrated and described with respect to FIG. 2.

At operation 406, the processing device closes the one or more blocks involved in the aborted memory operation. By closing the one or more blocks at operation 406, various example embodiments can avoid moving the data from the one or more blocks to one or more available blocks on the memory system (e.g., via a folding operation performed on the one or more blocks, which can be particularly expensive when the one or more blocks are part of one or more superblocks). Additionally, by closing the one or more blocks at operation 406, various example embodiments can permit data thus far stored on the one or more blocks to be read by the processing device while preventing any additional data to be written (e.g., programmed) to the one or more blocks.

As an alternative to operation 406 (not shown in FIG. 4), where the memory operation being performed during the PLRESET event is a write (e.g., programming) operation, the processing device can avoid moving data from the one or more blocks (e.g., via a folding operation on the one or more blocks), can skip the one or more pages being written during the write program, and continue writing data to one or more next pages within the same one or more blocks.

Referring now to FIG. 5, method 500 represents another method for handling a PLRESET low event in a memory system with a technique that mitigates the risk of a memory die of a memory device being retired prematurely. At operation 502, a processing device (e.g., the processor 117 of the memory sub-system controller 115) monitors for PLRESET low events on a memory device (e.g., 130, 150) of a memory system (e.g., memory sub-system 110). For various example embodiments, a PLRESET low event differs from a normal PLRESET event and comprises a memory die (of a memory device) aborting any ongoing memory operations on the memory die in response to a supply voltage to the memory die dropping below a second threshold voltage value that is lower than a first threshold voltage value associated with a normal PLRESET event. The second threshold voltage value can represent (or be set to) a value that represents a minimum supply voltage needed by the memory die in order for transistors (e.g., CMOS transistors) in the memory die to operate correctly. For instance, where a first threshold voltage value associated with a normal PLRESET event can be set to a value of 2.1V, a second threshold voltage value associated with a PLRESET low event can be set to a value of 1.9V.

During operation 504, the processing device detects that a PLRESET low event has occurred on a memory die of the memory device. In response to detecting that a PLRESET low event has occurred on the memory die, method 500 proceeds to operation 506, where the processing device retires the memory die. According to some example embodiments, once a memory die of a memory device is retired, the memory die becomes unavailable for use on the memory device (and by the memory system) and remains unavailable for use until the memory die is reinitialized the memory die for use, thereby unretiring the memory die.

At operation 508, the processing device causes the memory die to be reinitialized when the memory device is next powered up. For example, operation 508 can comprise the processing device setting a flag or a register of the memory system (e.g., memory sub-system 110) that causes the processing device to reinitialize the retired memory die on the next power up of the memory device (e.g., next power cycle of the memory device), which can occur when the memory system is next powered up (e.g., next power cycle of the memory system).

During operation 510, the processing device uses an error-correction technique (or process) supported by the memory device to recover data stored on the memory die (and no longer accessible from the memory die in view of its retirement at operation 506). For example, data stored on the memory die can be protected by a RAIN error correction technique, and the processing device can use a RAIN-based recovery process with data stored on multiple other memory die of the memory device to recover data stored in the (retired) memory die. In particular, when the memory die is retired, the processing device can recover the data from the retired memory die by using (e.g., XORing together) parity data in RAIN stripes and the data from other (working/good) memory die. For some example embodiments, operation 510 is performed as part of operation 506 (e.g., when a memory die is retired using a RAIN error correction technique) rather than a separate operation.

Alternatively, at operation 512, the processing device performs a test process on the memory die after the memory die is reinitialized. For some example embodiments, the test process is performed on the memory die (at operation 512) prior to the memory system being allowed to resume usage of the memory die, where the memory system is allowed to resume using the memory die only if the memory die passes the test process. For various example embodiments, performing the test process on a memory die comprises at least one: erasing any data from the memory die; writing data to the memory die; or reading data from the memory die. For example, to verify whether the memory die is good and should be reinitialized (e.g., unretired), the test process can first erase any data from the memory die, then write test data to the memory die, and then read back the test data stored on the memory die. If the read operation on the memory die fails or the test data read back from the memory die is not the same as the test data written to the individual block, the test process could retire the memory die again and prevent the memory system from resuming use of the memory die. However, if the read operation is successful and the test data read back from the memory die is the same as the test data written to the individual block, the test process can leave the memory die unretired and the memory system can resume using the memory die.

Figure 6:
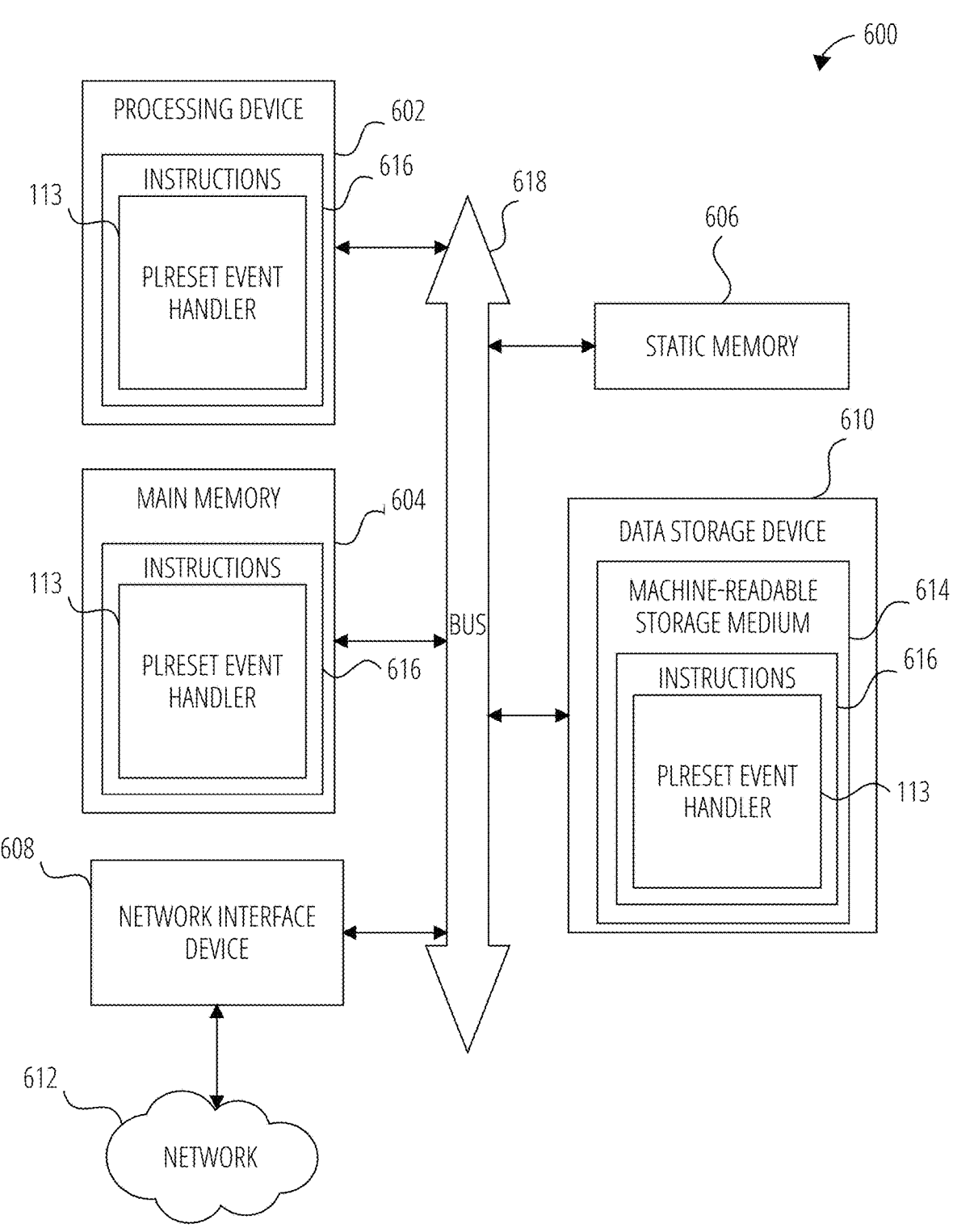
FIG. 6 is a block diagram of an example computer system in which example embodiments of the present disclosure may operate.

FIG. 6 illustrates an example machine in the form of a computer system 600 within which a set of instructions can be executed for causing the machine to perform any one or more of the methodologies discussed herein. In some example embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations described herein. In alternative example embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., ROM, flash memory, DRAM such as SDRAM or Rambus DRAM (RDRAM), etc.), a static memory 606 (e.g., flash memory, static random access memory (SRAM), etc.), and a data storage device 610, which communicate with each other via a bus 618.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application-specific integrated circuit (ASIC), a field programmable gate array (FPGA), a digital signal processor (DSP), a network processor, or the like. The processing device 602 is configured to execute instructions 616 for performing the operations and steps discussed herein. The computer system 600 can further include a network interface device 608 to communicate over a network 612.

The data storage device 610 can include a machine-readable storage medium 614 (also known as a computer-readable medium) on which is stored one or more sets of instructions 616 or software embodying any one or more of the methodologies or functions described herein. The instructions 616 can also reside, completely or at least partially, within the main memory 604 and/or within the processing device 602 during execution thereof by the computer system 600, the main memory 604 and the processing device 602 also constituting machine-readable storage media. The machine-readable storage medium 614, data storage device 610, and/or main memory 604 can correspond to the memory sub-system 110 of FIG. 1.

In one example embodiment, the instructions 616 include instructions to implement functionality corresponding to providing PLRESET event handling as described herein (e.g., the PLRESET event handler 113 of FIG. 1). While the machine-readable storage medium 614 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Described implementations of the subject matter can include one or more features, alone or in combination as illustrated below by way of examples.

Example 1 is a system comprising: a memory device; and a processing device, operatively coupled to the memory device, configured to perform operations comprising: detecting that a power-loss reset (PLRESET) event has occurred on the memory device while a memory operation is being performed on a memory die of the memory device, the PLRESET event comprising the memory die aborting the memory operation in response to a supply voltage to the memory die dropping below a threshold voltage value; and in response to detecting that the PLRESET event occurred on the memory device while the memory operation is being performed on the memory die: marking one or more blocks of the memory die involved in the memory operation as bad blocks; and adding the one or more blocks to a set of bad blocks to be later tested by a test process.

In Example 2, the subject matter of Example 1 includes, wherein the operations comprise: in response to detecting that the PLRESET event occurred while the memory operation is being performed on the memory die, prior to marking the one or more blocks as bad blocks, causing data stored on the one or more blocks to be moved to a set of available blocks on the memory device.

In Example 3, the subject matter of Example 2 includes, wherein the causing of the data to be moved to the set of available blocks comprises: performing a folding operation on the one or more blocks.

In Example 4, the subject matter of Examples 1-3 includes, wherein the operations comprise: performing the test process on at least one block from the set of bad blocks, the test process comprising at least one erasing data from the at least one block, writing data to the at least one block, or reading data from the at least one block.

In Example 5, the subject matter of Examples 1-4 includes, wherein the operations comprise: performing the test process on at least one block from the set of bad blocks, the test process comprising: performing a set of memory operations on the at least one block; and monitoring whether any PLRESET events occur while the set of memory operations is performed on the at least one block.

In Example 6, the subject matter of Examples 1-5 includes, wherein the threshold voltage value comprises a first value, and wherein the operations comprise: performing the test process on at least one block from the set of bad blocks, the test process comprising: adjusting the threshold voltage value to a second value that is lower than the first value; performing a set of memory operations on the at least one block; and monitoring whether any PLRESET events occur while the set of memory operations is performed on the at least one block.

In Example 7, the subject matter of Examples 1-6 includes, wherein the performing of the test process is triggered in response to satisfaction of a condition.

In Example 8, the subject matter of Examples 1-7 includes, wherein the memory operation comprises at least one of a read operation, a write operation, or an erase operation.

In Example 9, the subject matter of Examples 1-8 includes, wherein the threshold voltage value is a first threshold voltage value, wherein the PLRESET event is a PLRESET non-low event, and wherein the operations comprise: detecting that a PLRESET low event has occurred on the memory die, the PLRESET low event occurs when the supply voltage to the memory die drops below a second threshold voltage value, the second voltage value being lower than the first threshold voltage value; and in response to detecting that the PLRESET low event occurred on the memory die: retiring the memory die; and causing the memory die to be reinitialized when the memory device is next powered up.

In Example 10, the subject matter of Example 9 includes, wherein the operations comprise: performing a test process on the memory die after the memory die is reinitialized.

In Example 11, the subject matter of Examples 9-10 includes, wherein data stored on the memory die is protected by a redundant array of independent NAND-type memory devices (RAIN) error correction technique, and wherein the operations comprise: in response to detecting that the PLRESET low event occurred on the memory die, using a RAIN-based recovery process with data stored on multiple other memory die of the memory device to recover data stored in one or more blocks of the memory die.

Example 12 is a method to implement any of Examples 1-11.

Example 13 is at least one machine-readable medium comprising instructions that, when executed by a processing device, cause the processing device to perform operations to implement any of Examples 1-11.

Example 14 is at least one non-transitory machine-readable storage medium comprising instructions that, when executed by a processing device, cause the processing device to perform operations comprising: detecting that a power-loss reset (PLRESET) event has occurred on a memory device while a memory operation is being performed on a memory die of the memory device, the PLRESET event comprising the memory die aborting the memory operation in response to a supply voltage to the memory die dropping below a threshold voltage value; and in response to detecting that the PLRESET event occurred on the memory device while the memory operation is being performed on the memory die: causing data, stored on one or more blocks of the memory die involved in the memory operation, to be moved to a set of available blocks on the memory device; and returning the one or more blocks to the set of available blocks.

In Example 15, the subject matter of Example 14 includes, wherein the operations comprise: maintaining an individual PLRESET event count for an individual block from the one or more blocks; and in response to determining that the individual PLRESET event count surpasses a threshold count value, marking the individual block as a bad block.

In Example 16, the subject matter of Examples 14-15 includes, wherein the operations comprise: maintaining an individual PLRESET event count for an individual block from the one or more blocks; and in response to determining that the individual PLRESET event count surpasses a threshold count value, adding the individual block to a set of bad blocks to be later tested by a test process.

In Example 17, the subject matter of Example 16 includes, wherein the operations comprise: performing the test process on at least one block from the set of bad blocks, the test process comprising at least one erasing data from the at least one block, writing data to the at least one block, or reading data from the at least one block.

In Example 18, the subject matter of Examples 16-17 includes, wherein the operations comprise: performing the test process on at least one block from the set of bad blocks, the test process comprising: performing a set of memory operations on the at least one block; and monitoring whether any PLRESET events occur while the set of memory operations is performed on the at least one block.

In Example 19, the subject matter of Examples 16-18 includes, wherein the threshold voltage value comprises a first value, and wherein the operations comprise: performing the test process on at least one block from the set of bad blocks, the test process comprising: adjusting the threshold voltage value to a second value that is lower than the first value; performing a set of memory operations on the at least one block; and monitoring whether any PLRESET events occur while the set of memory operations is performed on the at least one block.

In Example 20, the subject matter of Examples 16-19 includes, wherein the performing of the test process is triggered in response to satisfaction of a condition.

In Example 21, the subject matter of Examples 14-20 includes, wherein the causing of the data to be moved to the set of available blocks comprises: performing a folding operation on the one or more blocks.

Example 22 is a method to implement any of Examples 14-21.

Example 23 is a system to implement any of Examples 14-21.

Example 24 is a method comprising: detecting, a processing device, that a power-loss reset (PLRESET) event has occurred on a memory device while a memory operation is being performed on a memory die of the memory device, the PLRESET event comprising the memory die aborting the memory operation in response to a supply voltage to the memory die dropping below a threshold voltage value; and in response to detecting that the PLRESET event occurred on the memory device while the memory operation is being performed on the memory die, closing one or more blocks of the memory die involved in the memory operation, the one or more closed blocks allowing data stored on the one or more closed blocks to be read while preventing additional data from being written to the one or more closed blocks.

Example 25 is a system to implement Example 24.

Example 26 is at least one machine-readable medium comprising instructions that, when executed by a processing device, cause the processing device to perform operations to implement Example 24.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium (such as a non-transitory machine-readable medium) having stored thereon instructions, which can be used to program a computer system (or other electronic devices) to perform a process according to the present disclosure. A machine-readable medium includes any mechanism for storing information in a form readable by a machine (e.g., a computer). In some example embodiments, a machine-readable (e.g., computer-readable) medium includes a machine (e.g., a computer) readable storage medium such as a ROM, RAM, magnetic disk storage media, optical storage media, flash memory components, and so forth. A machine-readable storage medium can be non-transitory (in other words, not having any transitory signals) in that it does not embody a propagating signal. However, labeling a machine-readable storage medium "non-transitory" should not be construed to mean that the machine-readable storage medium is incapable of movement; the machine-readable storage medium should be considered as being transportable from one physical location to another.

In the foregoing specification, example embodiments of the disclosure have been described with reference to specific example embodiments thereof. It will be evident that various modifications can be made thereto without departing from the broader spirit and scope of example embodiments of the disclosure as set forth in the following claims. The specification and drawings are, accordingly, to be regarded in an illustrative sense rather than a restrictive sense.

The invention claimed is:

1. A system comprising:
a memory device; and
a processing device, operatively coupled to the memory device, configured to perform operations comprising:
detecting that a power-loss reset (PLRESET) event has occurred on the memory device while a memory operation is being performed on a memory die of the memory device, the PLRESET event comprising the memory die aborting the memory operation in response to a supply voltage to the memory die dropping below a threshold voltage value; and
in response to detecting that the PLRESET event occurred on the memory device while the memory operation is being performed on the memory die:
marking one or more blocks of the memory die involved in the memory operation as bad blocks; and
adding the one or more blocks to a set of bad blocks to be later tested by a test process.

2. The system of claim 1, wherein the operations comprise:
in response to detecting that the PLRESET event occurred while the memory operation is being performed on the memory die, prior to marking the one or more blocks as bad blocks, causing data stored on the one or more blocks to be moved to a set of available blocks on the memory device.

3. The system of claim 2, wherein the causing of the data to be moved to the set of available blocks comprises:
performing a folding operation on the one or more blocks.

4. The system of claim 1, wherein the operations comprise:
performing the test process on at least one block from the set of bad blocks, the test process comprising at least one erasing data from the at least one block, writing data to the at least one block, or reading data from the at least one block.

5. The system of claim 1, wherein the operations comprise:
performing the test process on at least one block from the set of bad blocks, the test process comprising:
performing a set of memory operations on the at least one block; and
monitoring whether any PLRESET events occur while the set of memory operations is performed on the at least one block.

6. The system of claim 1, wherein the threshold voltage value comprises a first value, and wherein the operations comprise:

performing the test process on at least one block from the set of bad blocks, the test process comprising:

adjusting the threshold voltage value to a second value that is lower than the first value;

performing a set of memory operations on the at least one block; and monitoring whether any PLRESET events occur while the set of memory operations is performed on the at least one block.

7. The system of claim 1, wherein the performing of the test process is triggered in response to satisfaction of a condition.

8. The system of claim 1, wherein the memory operation comprises at least one of a read operation, a write operation, or an erase operation.

9. The system of claim 1, wherein the threshold voltage value is a first threshold voltage value, wherein the PLRESET event is a PLRESET non-low event, and wherein the operations comprise:

detecting that a PLRESET low event has occurred on the memory die, the PLRESET low event occurs when the supply voltage to the memory die drops below a second threshold voltage value, the second voltage value being lower than the first threshold voltage value; and in response to detecting that the PLRESET low event occurred on the memory die:

retiring the memory die; and causing the memory die to be reinitialized when the memory device is next powered up.

10. The system of claim 9, wherein the operations comprise:

performing a test process on the memory die after the memory die is reinitialized.

11. The system of claim 9, wherein data stored on the memory die is protected by a redundant array of independent NAND-type memory devices (RAIN) error correction technique, and wherein the operations comprise:

in response to detecting that the PLRESET low event occurred on the memory die, using a RAIN-based recovery process with data stored on multiple other memory die of the memory device to recover data stored in one or more blocks of the memory die.

12. At least one non-transitory machine-readable storage medium comprising instructions that, when executed by a processing device, cause the processing device to perform operations comprising:

detecting that a power-loss reset (PLRESET) event has occurred on a memory device while a memory operation is being performed on a memory die of the memory device, the PLRESET event comprising the memory die aborting the memory operation in response to a supply voltage to the memory die dropping below a threshold voltage value; and in response to detecting that the PLRESET event occurred on the memory device while the memory operation is being performed on the memory die:

causing data, stored on one or more blocks of the memory die involved in the memory operation, to be moved to a set of available blocks on the memory device; and returning the one or more blocks to the set of available blocks.

13. The at least one non-transitory machine-readable storage medium of claim 12, wherein the operations comprise:

maintaining an individual PLRESET event count for an individual block from the one or more blocks; and in response to determining that the individual PLRESET event count surpasses a threshold count value, marking the individual block as a bad block.

14. The at least one non-transitory machine-readable storage medium of claim 12, wherein the operations comprise:

maintaining an individual PLRESET event count for an individual block from the one or more blocks; and in response to determining that the individual PLRESET event count surpasses a threshold count value, adding the individual block to a set of bad blocks to be later tested by a test process.

15. The at least one non-transitory machine-readable storage medium of claim 14, wherein the operations comprise:

performing the test process on at least one block from the set of bad blocks, the test process comprising at least one erasing data from the at least one block, writing data to the at least one block, or reading data from the at least one block.

16. The at least one non-transitory machine-readable storage medium of claim 14, wherein the operations comprise:

performing the test process on at least one block from the set of bad blocks, the test process comprising:

performing a set of memory operations on the at least one block; and monitoring whether any PLRESET events occur while the set of memory operations is performed on the at least one block.

17. The at least one non-transitory machine-readable storage medium of claim 14, wherein the threshold voltage value comprises a first value, and wherein the operations comprise:

performing the test process on at least one block from the set of bad blocks, the test process comprising:

adjusting the threshold voltage value to a second value that is lower than the first value;

performing a set of memory operations on the at least one block; and monitoring whether any PLRESET events occur while the set of memory operations is performed on the at least one block.

18. The at least one non-transitory machine-readable storage medium of claim 14, wherein the performing of the test process is triggered in response to satisfaction of a condition.

19. The at least one non-transitory machine-readable storage medium of claim 12, wherein the causing of the data to be moved to the set of available blocks comprises:

performing a folding operation on the one or more blocks.

20. A method comprising:

detecting, a processing device, that a power-loss reset (PLRESET) event has occurred on a memory device while a memory operation is being performed on a memory die of the memory device, the PLRESET event comprising the memory die aborting the memory operation in response to a supply voltage to the memory die dropping below a threshold voltage value; and in response to detecting that the PLRESET event occurred on the memory device while the memory operation is being performed on the memory die, closing one or more blocks of the memory die involved in the memory operation, the one or more closed blocks allowing data stored on the one or more closed blocks to be read while preventing additional data from being written to the one or more closed blocks.

\* \* \* \* \*